(12) United States Patent
Yeh et al.

(10) Patent No.: US 9,974,186 B2
(45) Date of Patent: May 15, 2018

(54) METHOD OF MANUFACTURING PRINTED CIRCUIT BOARD WITH EMBEDDED ELECTRONIC COMPONENTS POSITIONED BY USING SOLDER PASTE

(71) Applicant: UNITECH PRINTED CIRCUIT BOARD CORP., New Taipei (TW)

(72) Inventors: Ming Yi Yeh, New Taipei (TW); Shun Yueh Hsu, New Taipei (TW); Kun Chi Chen, New Taipei (TW); Hung Min Chen, New Taipei (TW)

(73) Assignee: UNITECH PRINTED CIRCUIT BOARD CORP., New Taipei (TW)

( * ) Notice: Subject to any disclaimer, the term of this patent is extended or adjusted under 35 U.S.C. 154(b) by 209 days.

(21) Appl. No.: 15/146,418

(22) Filed: May 4, 2016

(65) Prior Publication Data

US 2017/0006708 A1    Jan. 5, 2017

(30) Foreign Application Priority Data

Jun. 30, 2015    (TW) .............................. 104121090 A (51) Int. Cl.
*H05K 3/34*    (2006.01)
*H05K 1/18*    (2006.01)
(Continued)

(52) U.S. Cl.
CPC .......... *H05K 1/188* (2013.01); *H05K 3/4679* (2013.01); *H05K 1/0266* (2013.01); *H05K 1/186* (2013.01); *H05K 3/3442* (2013.01); *H05K 2201/1003* (2013.01); *H05K 2201/10015* (2013.01); *H05K 2201/10022* (2013.01); *H05K 2201/10106* (2013.01); *H05K 2203/0361* (2013.01); *H05K 2203/048* (2013.01); *H05K 2203/166* (2013.01); *H05K 2203/167* (2013.01);
(Continued)

(58) Field of Classification Search
CPC ............... H01L 2924/181; H01L 24/11; H01L 2224/11; H01L 2224/11849; H05K 2203/043; H05K 3/3494; Y10T 29/49155; Y10T 29/49126; Y10T 29/49124; Y10T 29/49144
USPC ........................... 29/840, 829, 830, 846, 852
See application file for complete search history.

(56) References Cited

U.S. PATENT DOCUMENTS 6,909,054 B2 * 6/2005 Sakamoto ........... H01L 21/4846
                                                  174/260
9,253,887 B2 * 2/2016 Wang .................. H01L 23/5389

* cited by examiner

*Primary Examiner* — Thiem Phan
(74) *Attorney, Agent, or Firm* — Muncy, Geissler, Olds & Lowe, P.C.

(57) ABSTRACT

A method of manufacturing a printed circuit board with embedded electronic components fixed by a solder paste includes: providing a carrier board with a copper foil layer on the carrier board, an insulating layer on the copper foil layer, and an opening on the insulating layer by laser; putting a solder paste into the opening to form a solder paste layer; performing a high-temperature reflow process of the electronic components on the solder paste layer until the solder paste layer is molten; curing the solder paste layer after cooling to fix the components to the center position of the opening; placing the copper foil layer below the electronic components and removing the solder paste layer; and performing copper plating and electroplating processes in an electroplating space to form a plating copper. The cohesion of the molten solder paste pulls the electronic components towards the center to eliminate position offset produced when the electronic components are installed.

15 Claims, 8 Drawing Sheets

(51) Int. Cl.
H05K 3/46 (2006.01)
H05K 1/02 (2006.01)
(52) U.S. Cl.
CPC ... *H05K 2203/308* (2013.01); *Y10T 29/49124* (2015.01); *Y10T 29/49144* (2015.01)

METHOD OF MANUFACTURING PRINTED CIRCUIT BOARD WITH EMBEDDED ELECTRONIC COMPONENTS POSITIONED BY USING SOLDER PASTE

FIELD OF THE INVENTION

The present invention relates to a method of manufacturing a printed circuit board, and more particularly to a method of manufacturing a printed circuit board with embedded electronic components positioned by using a solder paste.

BACKGROUND OF THE INVENTION

High speed and density are two major factors for driving the development of high technologies, not just lowering the production cost only, but most importantly also satisfying consumer requirements, so that electronic products and mobile communication products are tended to be developed with a light, thin, short and compact design, high reliability, and low cost, and these products are developed in a generation of every three to five years. To cope with the trend, electronic components occupying a relatively large area are also having an integrated revolution in the circuit design of the electronic products.

In a printed circuit board, the area occupied by the electronic components is the main limitation to a compact product, and many soldering points are added to the printed circuit board, and thus reducing the system reliability as well as increasing the manufacturing cost. With the requirements of high performance, small volume, and light weight, a larger space is wanted to be created in the substrate area of the printed circuit board with a limited area to enhance the functionality of modules, so that the integration and embedment of electronic components are important development trends.

To overcome the aforementioned issues, the electronic components are embedded traditionally, wherein a plastic carrier board is provided for fixing the electronic components, but this method is restricted to the precision of the SMT insertion machine, and if there is an offset occurred at the position of an electronic component with respect to the insertion machine, then a poor signal transmission will result. Alternatively, a solder paste is provided for fixing the electronic components and carrying out the electrical conduction, but the coefficient of expansion of the solder paste has a relatively large difference from the coefficient of expansion of other components in the printed circuit board, so that when there is a large temperature change, the thermal expansion and contraction of the solder paste gives rise to an unstable quality of the whole printed circuit board, and these are the drawbacks of the prior art.

SUMMARY OF THE INVENTION

Therefore, it is a primary objective of the present invention to overcome the aforementioned drawbacks of the prior art by providing a method of manufacturing a printed circuit board with embedded electronic components positioned by using a solder paste.

To achieve the aforementioned and other objectives, the present invention provides a method that uses the cohesion of a molten solder paste to pull electronic components towards the center in order to eliminate any position offset occurred during the process of installing the electronic components, and also uses a plating copper for the electrical conduction of a first copper foil layer with the electrodes of an electronic component. Compared with the traditional way of using a solder paste for the electrical conduction, the present invention uses a better method than the traditional methods.

The method of the present invention comprises the following steps:

Step 1: Provide a first carrier board, wherein the first carrier board has a first copper foil layer disposed thereon.

Step 2: Attach or coat an insulating layer onto the first copper foil layer.

Step 3: Form at least one opening on the insulating layer.

Step 4: Inject a solder paste into the opening to form a solder paste layer, and then install an electronic component on the solder paste layer, wherein the electronic component has a plurality of electrodes.

Step 5: Perform a high-temperature reflow process until the solder paste layer is molten, and use the cohesion of the molten solder paste to pull the electronic component towards the center of the opening of the solder paste layer on the first copper foil layer, so as to eliminate the position offset of the electronic component while installing the solder paste layer in Step 4.

Step 6: Set a dielectric layer on the insulating layer, and set a second copper foil layer on the dielectric layer, and set a second carrier board on the second copper foil layer, and then carry out a lamination step.

Step 7: Remove the first carrier board and the second carrier board after the lamination process, so as to complete the basic printed circuit board with an embedded electronic component.

Step 8: Etch the first copper foil layer disposed under the electronic component by a process including the steps of attaching a photosensitive film, exposing the photosensitive film, removing the photosensitive film, and etching the desired layer, and also remove the solder paste layer to expose the electrodes of the electronic component, and form an electroplating space at the etching position of the first copper foil layer and at the position of removing the solder paste layer.

Step 9: Perform copper plating and electroplating processes to the bottom side of the first copper foil layer and the top side of the second copper foil layer in the electroplating space to form a plating copper, so that the first copper foil layer may be electrically conducted with the electrodes of the electronic component, wherein the plating copper at the bottom side of the first copper foil layer in the electroplating space is a first plating copper, and the plating copper at the top side of the second copper foil layer in the electroplating space is a second plating copper.

Step 10: Form circuits on the first copper foil layer and the first plating copper to produce a first circuit layer, and form circuits on the second copper foil layer and the second plating copper to produce a second circuit layer.

Wherein, the insulating layer as described in Step 2 is pure adhesive, liquid resin or epoxy resin, and coated onto the first copper foil layer by attaching a plastic plate or coating a liquid adhesive, and the insulating layer is formed after aging.

Wherein, a step carried out between Steps 2 and 3 further comprises the following steps: In the first carrier board, the first copper foil layer and the insulating layer are drilled with a plurality of alignment holes and a plurality of fixing holes; the alignment holes are provided for alignment required in a follow-up process, and the fixing holes are provided for receiving a fastener for fixing required in a follow-up process.

Wherein, the opening as described in Step 3 is a single opening, and the single opening has a size at least covering a portion of the electrodes of the embedded electronic component.

Wherein, the opening as described in Step 3 includes a plurality of openings and each having a size at least covering a portion of an electrode of the embedded electronic component.

Wherein, the electronic component as described in Step 4 is an active electronic component, a passive electronic component, a light emitting component, or a combination of the above.

Wherein, the dielectric layer as described in Step 6 is a polyester film with high resin content, a dielectric film, or a combination of the polyester film and the dielectric film.

Wherein, the dielectric layer as described in Step 6 has a slot for receiving the electronic component in advance, and the slot is formed by mechanical drilling, laser drilling, or die punching.

Wherein, the dielectric layer as described in Step 6 includes a first dielectric layer, a second dielectric layer and a third dielectric layer, and in Step 6, a first dielectric layer is formed on the insulating layer; a second dielectric layer is formed on the first dielectric layer; a third dielectric layer is formed on the second dielectric layer and the electronic component; a first laminar circuit layer is added onto the third dielectric layer, and the first laminar circuit layer includes the second copper foil layer disposed on the third dielectric layer and the second carrier board disposed on the second copper foil layer.

Wherein, the first dielectric layer, the second dielectric layer, the third dielectric layer and the first laminar circuit layer are drilled with a fixing hole at a position corresponsive to the first copper foil layer in advance, so that a penetrating fixing hole is formed and provided for receiving a fastener for the fixing purpose.

Wherein, the solder paste layer as described in Step 8 is removed and washed away by a chemical solution such as a nitric acid solution.

Wherein, the method further comprises the following step after removing the first carrier board and the two carrier boards as described in Step 7, and a penetrating hole is formed by mechanical drilling.

Wherein, the copper plating and electroplating processes as described in Step 9 further comprise the step of performing copper plating and electroplating processes to the penetrating hole together with its hole wall to form a plating copper, and the plating copper at the hole wall of the penetrating hole is a third plating copper.

Wherein, the method further comprises the following steps after Step 10: A fourth dielectric layer is set under the first circuit layer, and a fifth dielectric layer is set on top of the second circuit layer, and a lamination process of the laminar circuit layer is performed to the outer layers of the fourth dielectric layer and the fifth dielectric layer. In other words, the process takes place at the outer layer of a third laminar circuit layer under the fourth dielectric layer and the outer layer of a fourth laminar circuit layer on top of the fifth dielectric layer, and the electronic component is electrically coupled to the third laminar circuit layer and the fourth laminar circuit layer, so as to form a multi-layer printed circuit board with embedded electronic components.

Wherein, a penetrating hole is formed on the multi-layer printed circuit board by mechanical drilling, and copper metallization and through-hole plating are performed to the penetrating hole, so that the electronic component is electrically conducted to the first circuit layer, the second circuit layer, the third laminar circuit layer, and the fourth laminar circuit layer.

The technical characteristics, contents, advantages and effects of the present invention will be apparent with the detailed description of a preferred embodiment accompanied with the illustration of related drawings as follows.

DESCRIPTION OF THE PREFERRED EMBODIMENTS

Figure 1:
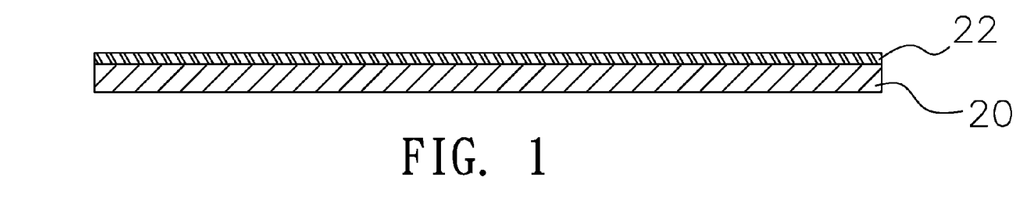
FIG. 1 shows Step 1 of a manufacturing method of an embodiment of the present invention.

With reference to FIGS. 1~11 for a method of manufacturing a printed circuit board with embedded electronic components positioned by using a solder paste in accordance with an embodiment of the present invention, the method comprises the following steps:

Step 1: Provide a first carrier board 20 as shown in FIG. 1, wherein the first carrier board 20 has a first copper foil layer 22 disposed thereon; the first carrier board 20 is provided for a carrying purpose in the manufacturing process, and the first carrier board 20 is removed after use, and the first carrier board 20 may be a metal board or a FR4 board (which is a board made of a FR4 graded material specified according to the standard of National Electrical Manufacturers Association (NEMA) and used as a substrate of a PCB).

Figure 2:
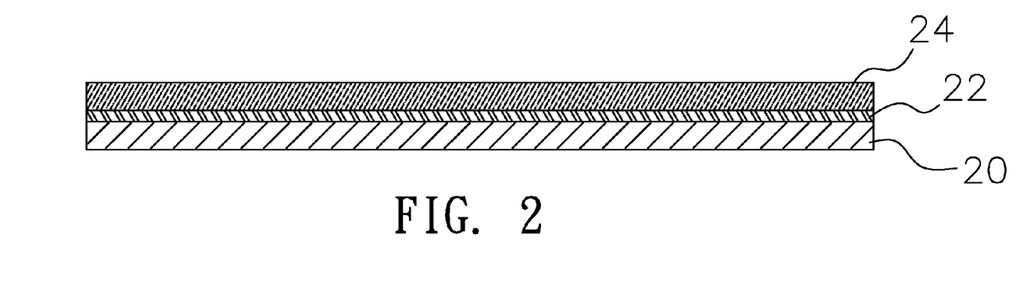
FIG. 2 shows Step 2 of a manufacturing method of an embodiment of the present invention.

Step 2: Attach or coat an insulating layer 24 onto the first copper foil layer 22 as shown in FIG. 2, wherein the insulating layer 24 is made of pure adhesive, liquid resin (adhesive gel) or epoxy resin and manufacturing by attaching a plastic plate or coating a liquid adhesive onto the first copper foil layer 22, and the adhesive or resin is aged to form the insulating layer 24 which is provided for the insulation purpose.

Figure 3:
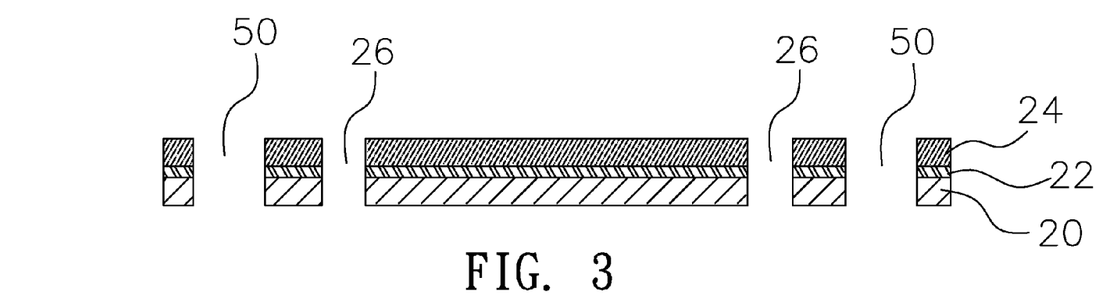
FIG. 3 shows a follow-up procedure of Step 2 of a manufacturing method of an embodiment of the present invention.

A step is carried out between Steps 2 and 3 as shown in FIG. 3, and this step further comprises the following steps. The first carrier board 20, the first copper foil layer 22 and the insulating layer 24 are drilled to form a plurality of alignment holes 26 and fixing holes 50; wherein the alignment holes 26 are formed by a drilling method including but not limited to laser drilling or mechanical drilling, and the alignment holes 26 are provided for alignment required by a follow-up process (for example, an opening is formed by laser for installing an electronic component).

The fixing holes 50 are provided for receiving a fastener for the fixing purpose required in a follow-up process.

Figure 4A:
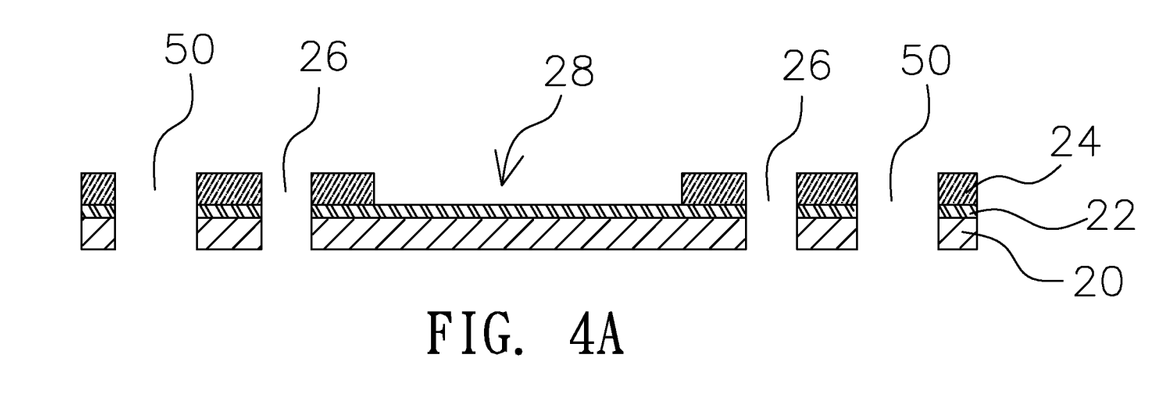
FIG. 4A shows Step 3 of a manufacturing method of an embodiment of the present invention.
Figure 4B:
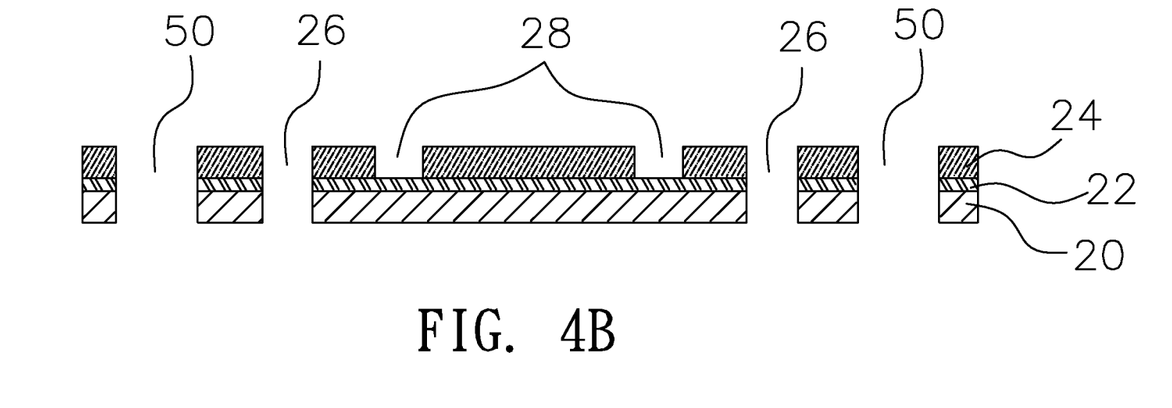
FIG. 4B shows Step 3 of a manufacturing method of an embodiment of the present invention.

Step 3: At least one opening 28 is formed on the insulating layer 24 as shown in FIGS. 4A and 4B, and the tool for manufacturing the opening 28 is not limited, and the opening 28 may be formed by laser or drilling. In FIG. 4A, the opening 28 is a single opening, but the size of the single opening must be large enough to cover the portion of the electrodes of the embedded electronic component. In FIG. 4B, the opening 28 includes a plurality of openings 28, and the size of each opening 28 must be large enough to cover the portion of an electrode of the embedded electronic component.

Figure 5:
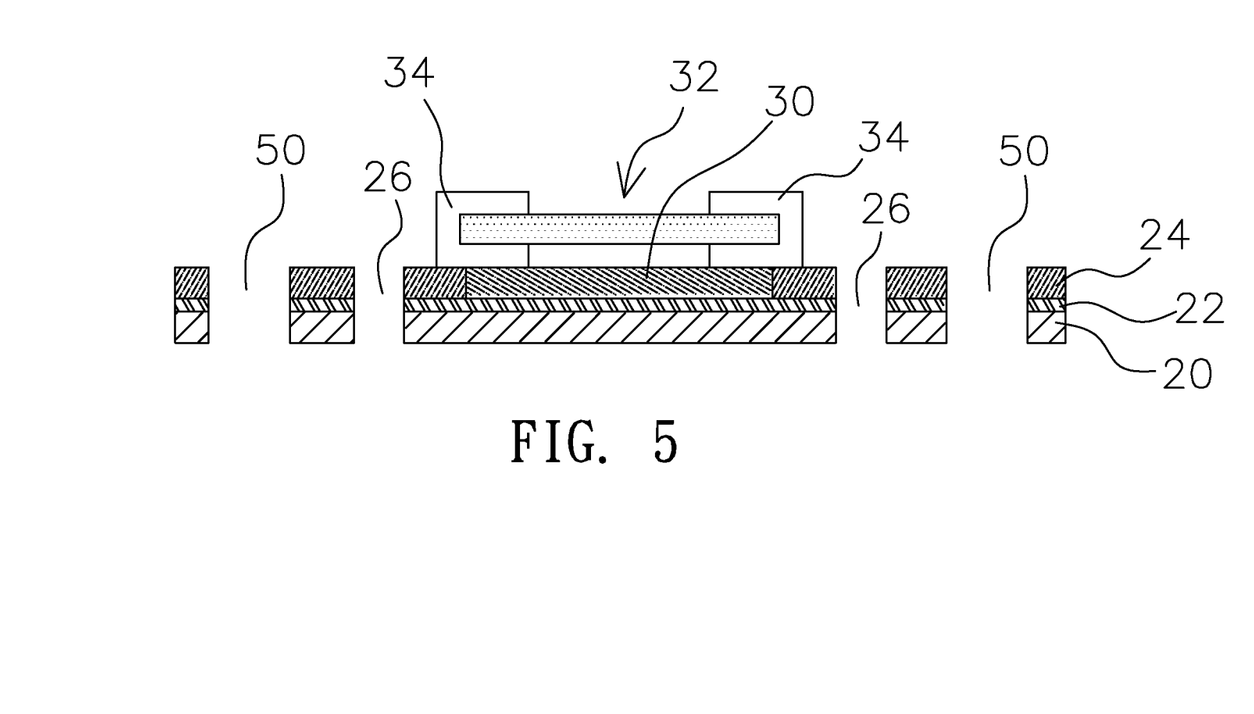
FIG. 5 shows Steps 4 and 5 of a manufacturing method of an embodiment of the present invention.

Step 4: In FIG. 5, a solder paste is injected into the opening 28 to form a solder paste layer 30, and an electronic component 32 is set on the solder paste layer 30, and the electronic component 32 has a plurality of electrodes 34; wherein, the electronic component 32 is an active electronic component (such as a chip), a passive electronic component (such as a resistor, a capacitor, and an inductor), a light emitting device (such as a light emitting diode, LED), or a combination of the above, and the type and quantity of the electronic component 32 are not limited. In this embodiment, a passive electronic component (a capacitor) is used for illustrating the invention.

Step 5: A high-temperature reflow process is performed as shown in FIG. 5, so that the solder paste layer 30 is molten, and the cohesion of the molten solder paste is used to pull the electronic component 32 towards the center of the opening 28 formed on the first copper foil layer 22 and wherein the solder paste layer 30 is located, and the solder paste layer 30 is cured after cooling, so as to fix the electronic component 32 to the center position of the opening 28 formed on the first copper foil layer 22 and wherein the solder paste layer 30 is located, so as to eliminate any position offset occurred while installing the electronic component 32 on the solder paste layer 30 in Step 4, and one of the traditional methods uses a plastic carrier board to fix the electronic component, but such method is limited by the precision of the SMT insertion machine, and if there is an offset of the position of the electronic component, a poor signal transmission will be resulted, and such traditional method is unable to achieve the effect of the present invention which can pull the electronic component 32 towards the center of the opening 28 formed on the first copper foil layer 22 and wherein the solder paste layer 30 is located. Further, the compositions of the molten solder paste layer 30 include a flux and a metal alloy powder, and the metal alloy powder is an alloy composed of different metals such as tin (Sn) silver (Ag), copper (Cu), and bismuth (Bi) of different proportions. Since the high-temperature molten metal and the metal are attracted to each other, therefore the molten solder paste layer 30 will be attracted to the electrode 34 of the electronic component 32, and the molten solder paste layer 30 is moved inwardly by cohesion, so that if there is a position offset of the electronic component 32 and the molten solder paste layer 30 is moved inwardly, the electronic component 32 will be pulled towards the center of the opening 28 formed on the first copper foil layer 22 and where the solder paste layer 30 is located, so as to achieve the effect of pulling the electronic component 32 to the correct position.

Figure 6:
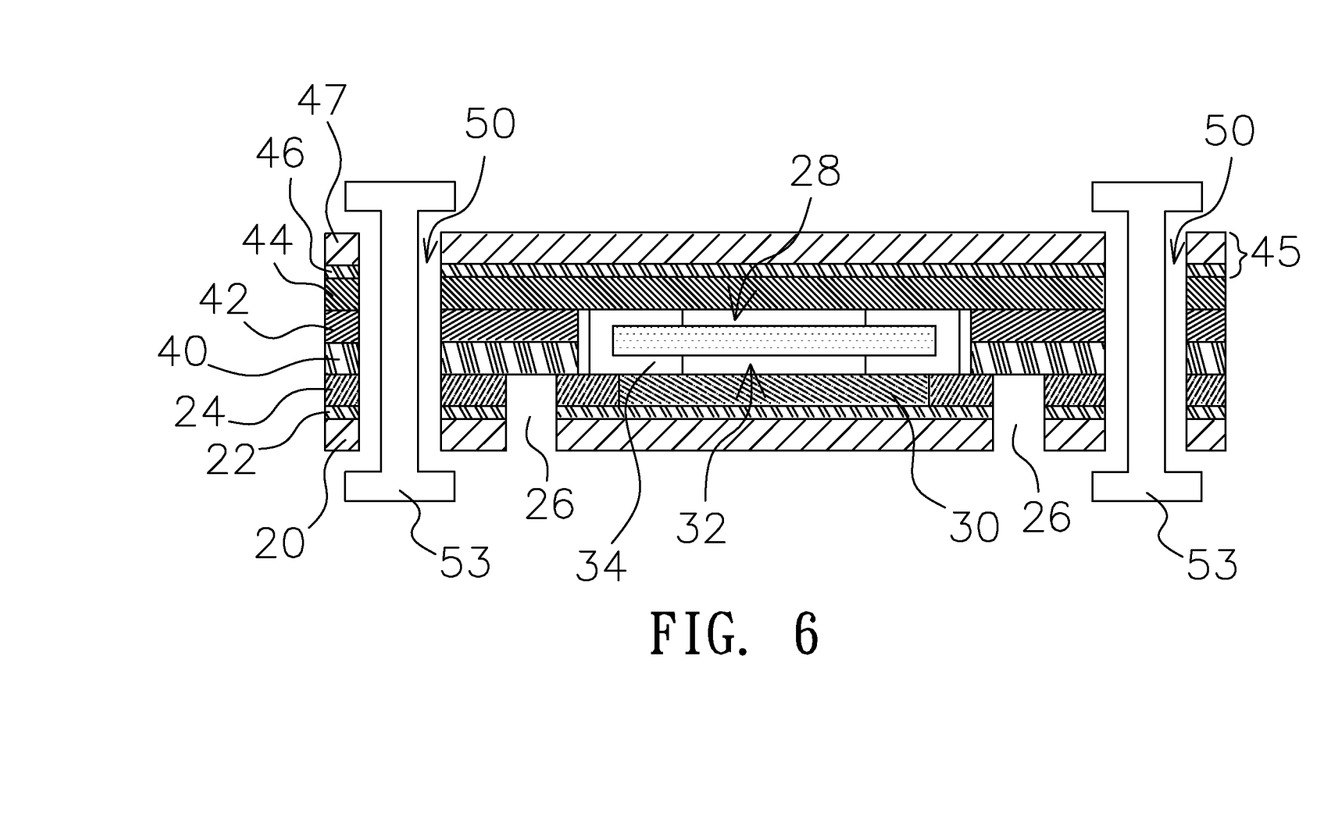
FIG. 6 shows Step 6 of a manufacturing method of an embodiment of the present invention.

Step 6: A dielectric layer is set on the insulating layer 24, and a second copper foil layer 46 is set on the dielectric layer, and a second carrier board 47 is set on the second copper foil layer 46, and a lamination step is performed as shown in FIG. 6.

Further, the dielectric layer comprises a first dielectric layer 40, a second dielectric layer 42 and a third dielectric layer 44. In this step, a first dielectric layer 40 is set on the insulating layer 24, wherein the first dielectric layer 40 has a slot (not shown in the figure) formed thereon in advance for receiving the electronic component 32; and a second dielectric layer 42 is set on the first dielectric layer 40 wherein the second dielectric layer 42 has a slot (not shown in the figure) formed thereon in advance for receiving the electronic component 32; a third dielectric layer 44 is set on the second dielectric layer 42 and the electronic component 32, wherein the third dielectric layer 44 has a slot (not shown in the figure) formed thereon in advance for receiving the electronic component 32, or not slot is formed on the dielectric layers (no slot is shown in the figure); a first laminar circuit layer 45 is added to the third dielectric layer 44, wherein the first laminar circuit layer 45 includes the second copper foil layer 46 on the third dielectric layer 44 and a second carrier board 47 on the second copper foil layer 46. In an embodiment, the first dielectric layer 40, the second dielectric layer 42, the third dielectric layer 44 and the first laminar circuit layer 45 are drilled with a hole at the fixing hole 50 of the first copper foil layer 22, and a penetrating fixing hole 50 is formed, and the fixing holes 50 are provided for receiving a fastener 53 (which is a rivet in this embodiment) to achieve a fixing effect. Wherein, the first dielectric layer 40, the second dielectric layer 42 and the third dielectric layer 44 are made of a mouldable material such as a polyester film (Prepreg) with high resin content, a dielectric film, and a combination of the polyester film and the dielectric film. With the mouldable property of the first dielectric layer 40, the second dielectric layer 42 and the third dielectric layer 44, the gap between the electronic component 32 and the opening 28 can be filled tightly to enhance the fixing strength of the electronic component 32. Similarly, when the first laminar circuit layer 45 is processed, the buffering effect and pressure resistance can be improved to prevent the embedded electronic component 32 from being pressed and damaged by gravitational force during the manufacturing process. Wherein, the first dielectric layer 40 and the second dielectric layer 42 have slots formed thereon in advance for receiving the electronic component 32, and the slots may be formed by a drilling method including but not limited to mechanical drilling, laser drilling or die punching.

Figure 7:
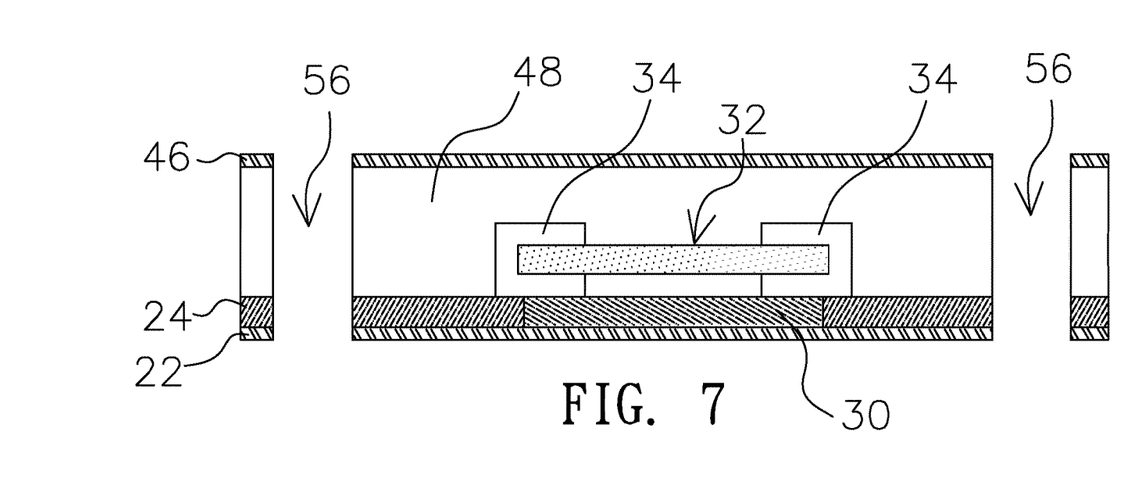
FIG. 7 shows Step 7 of a manufacturing method of an embodiment of the present invention.

Step 7: The first carrier board 20, the second carrier board 47 and the fasteners 53 are removed after lamination as shown in FIG. 7. In an embodiment, a penetrating hole 56 is formed by mechanical drilling, so as to produce a basic printed circuit board with an embedded electronic component 32. Wherein, after the first dielectric layer 40, the second dielectric layer 42 and the third dielectric layer 44 are laminated as described in Step 6, the three dielectric layers are combined with one another, which is indicated by the middle dielectric layer 48 in FIG. 7.

Figure 8:
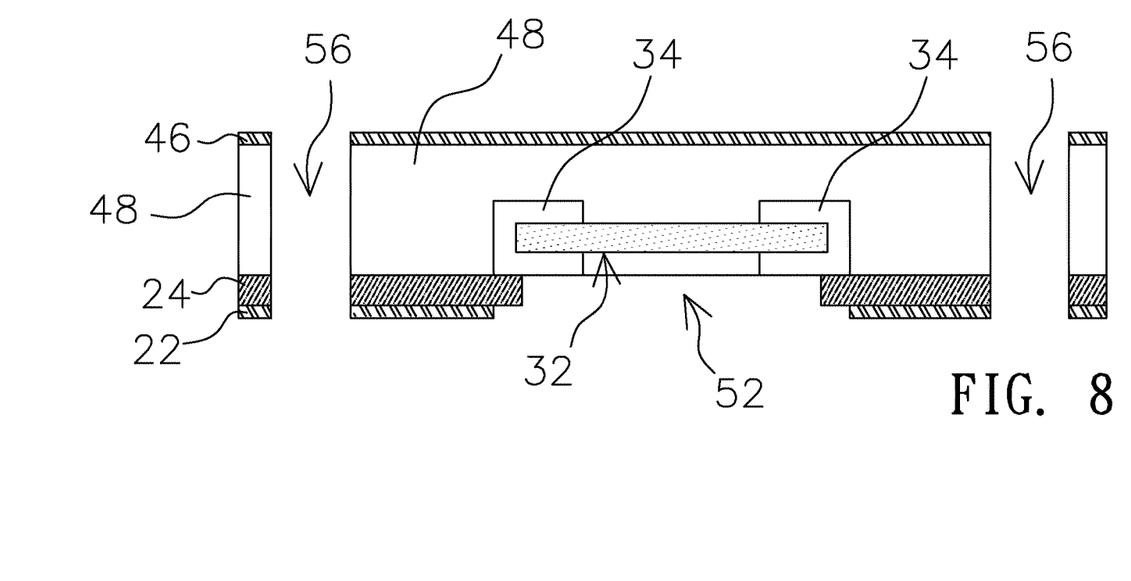
FIG. 8 shows Step 8 of a manufacturing method of an embodiment of the present invention.

Step 8: The first copper foil layer 22 disposed under the electronic component 32 is etched to remove the solder paste layer 30 by a process including the steps of attaching a photosensitive film, exposing the photosensitive film, removing the photosensitive film, and etching the desired layer, and also remove the solder paste layer to expose the electrodes of the electronic component, and form an electroplating space at the etching position of the first copper foil layer and at the position of removing the solder paste layer as shown in FIG. 8, so that the electrode 34 of the electronic component 32 is exposed, and an electroplating space 52 is formed at the position of etching the first copper foil layer 22 and at the position of removing the solder paste layer 30, wherein one of the methods of removing the solder paste layer 30 is wash away the solder paste layer 30 by a chemical solution, wherein the chemical solution includes a nitric acid solution, with a concentration of 15%~40% by weight, and the nitric acid solution is capable of washing the solder paste layer 30 away from the printed circuit board by a chemical reaction.

Figure 9:
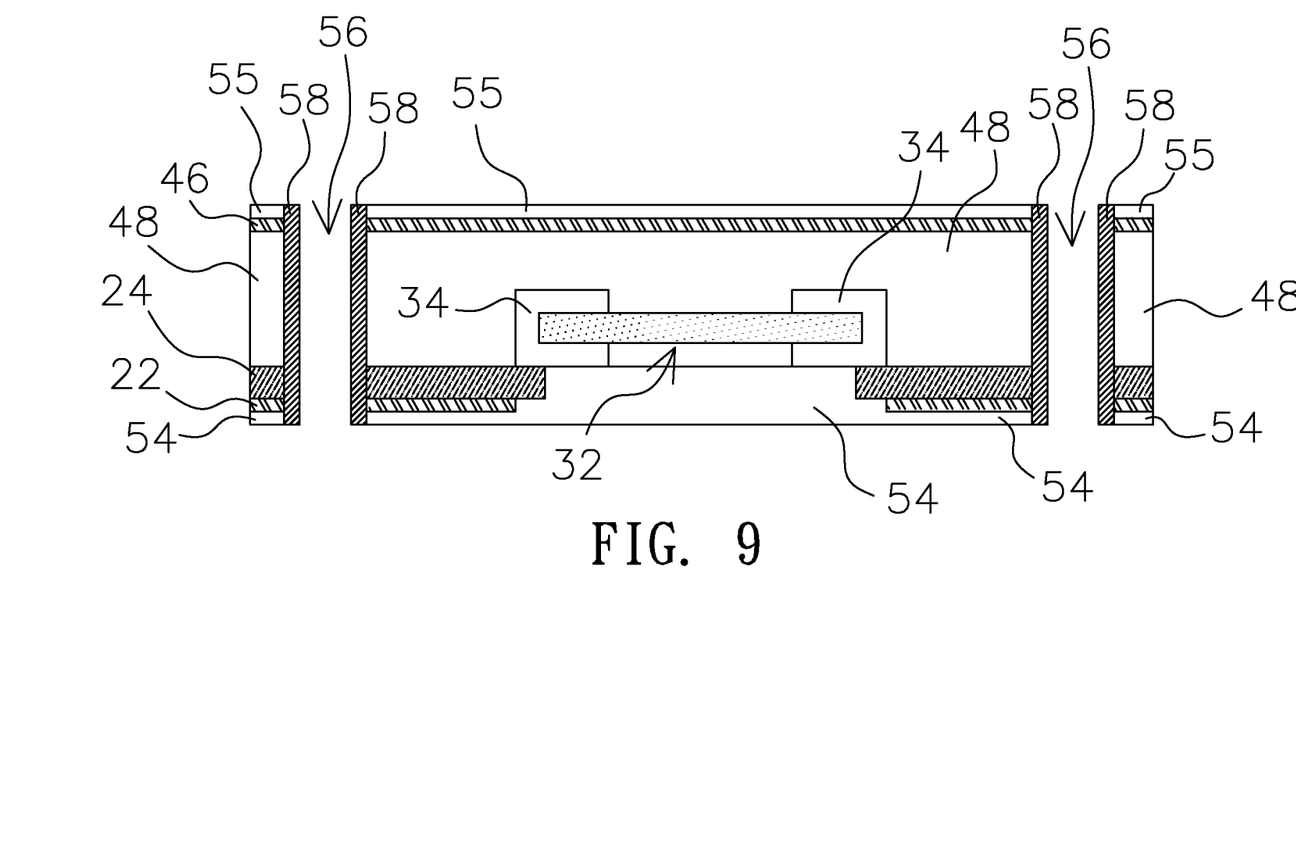
FIG. 9 shows Step 9 of a manufacturing method of an embodiment of the present invention.

Step 9: Copper plating and electroplating processes are performed to the bottom side of the first copper foil layer 22, the top side of the second copper foil layer 46, the hole wall of the penetrating hole 56 and the electroplating space 52 to form a plating copper as shown in FIG. 9, so that the first copper foil layer 22 is electrically conducted with the electrode 34 of the electronic component 32, and the first copper foil layer 22 and the first plating copper 54 are electrically conducted with the second copper foil layer 46 and the second plating copper 55, wherein the plating copper on the bottom side of the first copper foil layer 22 in the electroplating space 52 is a first plating copper 54, and the plating copper on the top side of the second copper foil layer 46 is a second plating copper 55, and the plating copper on the hole wall of the penetrating hole 56 is a third plating copper 58. The aforementioned plating coppers are used for electrically conducting the first copper foil layer 22 with the electrode 34 of the electronic component 32, and the method of the present invention is better than the traditional way of using a solder paste to achieve the effect of the electrical conduction, since the printed circuit board of the present invention contains no solder paste, and the solder paste is different from materials of the printed circuit board, so that the difference between the coefficients of expansion the materials are large. If there is a large temperature change, the thermal expansion and contraction of the solder paste will cause unstable quality of the whole printed circuit board. Therefore, the present invention using a plating copper for electrically conducting the first copper foil layer 22 with the electrode 34 of the electronic component 32 is better than the traditional method.

Figure 10:
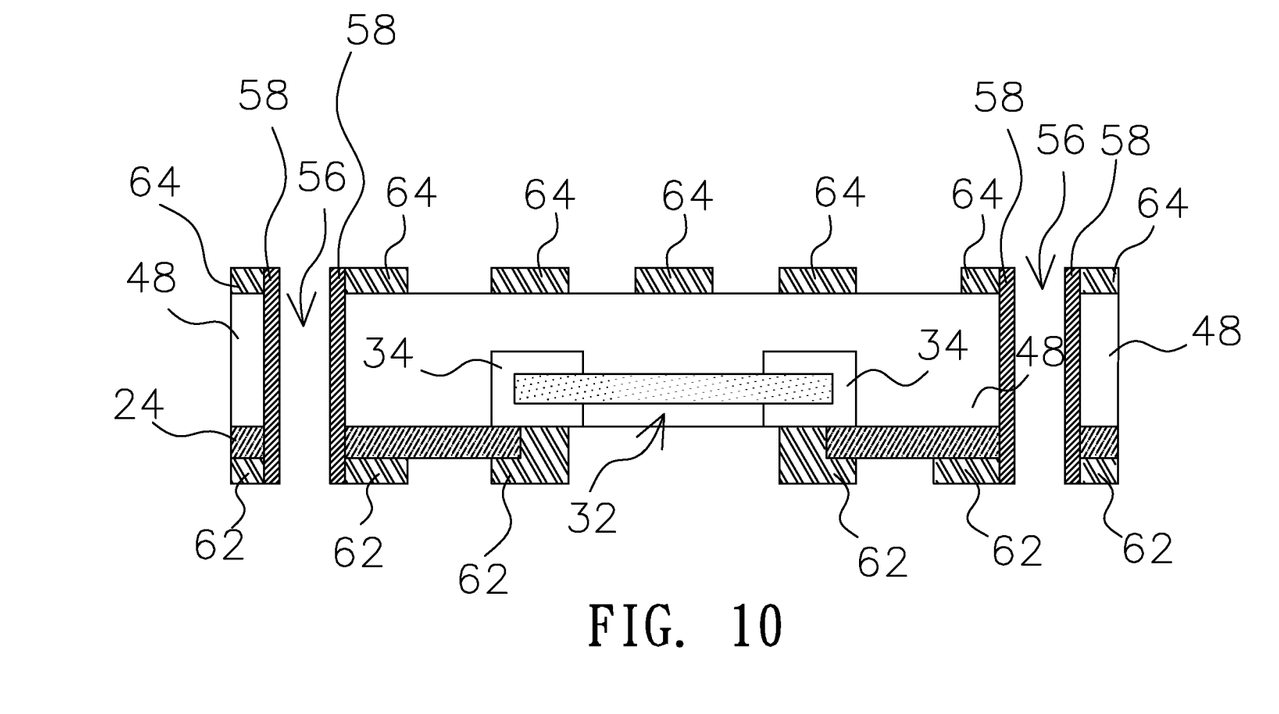
FIG. 10 shows Step 10 of a manufacturing method of an embodiment of the present invention.

Step 10: Circuits are formed on the first copper foil layer 22 and the first plating copper 54 to produce a first circuit layer 62 and circuits are formed on the second copper foil layer 46 and the second plating copper 55 to produce a second circuit layer 64 as shown in FIG. 10.

Figure 11:
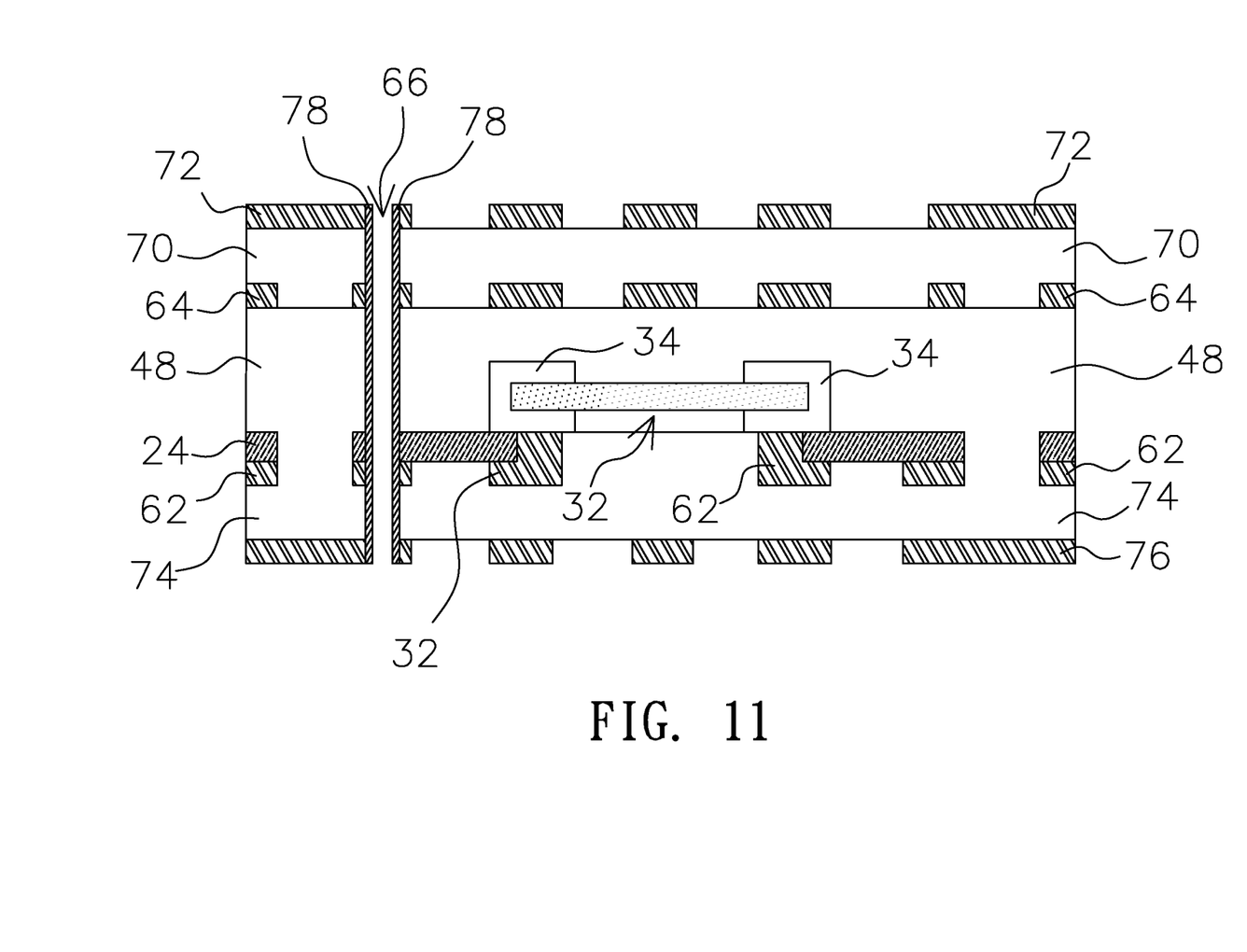
FIG. 11 shows a step of lamination of a manufacturing method of an embodiment of the present invention.

The method further comprises the following steps after Step 10 as shown in FIG. 11. A fourth dielectric layer 74 is set under the first circuit layer 62, and a fifth dielectric layer 70 is set on top of the second circuit layer 64, and a lamination process of the laminar circuit layer is performed on the outer layers of the fourth dielectric layer 74 and the fifth dielectric layer 70. In other words, a lamination process of a third laminar circuit layer 76 is performed under the fourth dielectric layer 74, and a lamination layer of a fourth laminar circuit layer 72 is performed at the top of the fifth dielectric layer 70, and the electronic component 32, the third laminar circuit layer 76 and the fourth laminar circuit layer 72 are electrically conducted with each other, so as to complete manufacturing a multi-layer printed circuit board with embedded electronic components.

Wherein, the penetrating hole 66 is formed by mechanical drilling, and copper plating and electroplating processes are performed, so that an electroplating layer 78 is formed at the inner periphery of the penetrating hole 66, and the electronic component 32 is electrically conducted with the first circuit layer 62, the second circuit layer 64, the third laminar circuit layer 76, and the fourth laminar circuit layer 72.

In the method of manufacturing a printed circuit board with embedded electronic components positioned by using a solder paste in accordance with the present invention, the cohesion of a molten solder paste is used to pull the electronic component towards the center in order to eliminate any position offset occurred while installing the electronic component, and the present invention further uses a plating copper for electrically conducing the first copper foil layer with the electronic component, and this method is better the traditional method of using a solder paste for the electrical conduction.

In summation of the description above, the present invention is a major breakthrough of the prior art and complies with patent application requirements, and is thus duly filed for patent application. While the invention has been described by means of specific embodiments, numerous modifications and variations could be made thereto by those skilled in the art without departing from the scope and spirit of the invention set forth in the claims.

What is claimed is:

1. A method of manufacturing a printed circuit board with embedded electronic components positioned by using a solder paste, comprising the steps of:
   (Step 1) providing a first carrier board having a first copper foil layer disposed thereon;
   (Step 2) attaching or coating an insulating layer onto the first copper foil layer;
   (Step 3) forming at least one opening on the insulating layer;
   (Step 4) placing a solder paste into the opening to form a solder paste layer, and then placing an electronic component on the solder paste layer, wherein the electronic component has a plurality of electrodes;
   (Step 5) performing a high-temperature reflow process to melt the solder paste layer into a molten state, and uses the cohesion of the molten solder paste to pull the electronic component to the center of the opening disposed on the solder paste layer on top of the first copper foil layer, so as to eliminate a position offset produced when placing the solder paste layer onto the electronic component in Step 4;
   (Step 6) setting a dielectric layer on the insulating layer, a second copper foil layer on the dielectric layer, and a second carrier board on the second copper foil layer, and then carrying out a lamination step;
   (Step 7) removing the first carrier board and the second carrier board after the lamination process, so as to complete the basic printed circuit board with an embedded electronic component;
   (Step 8) etching the first copper foil layer disposed under the electronic component by a process including the steps of attaching a photosensitive film, exposing the photosensitive film, removing the photosensitive film, and etching the desired layer, and also removing the solder paste layer to expose the electrodes of the electronic component, and forming an electroplating space at the etching position of the first copper foil layer and at the position of removing the solder paste layer;
   (Step 9) performing copper plating and electroplating processes to the bottom side of the first copper foil layer and the top side of the second copper foil layer in the electroplating space to form a plating copper, so that the first copper foil layer is electrically conducted with the electrode of the electronic component, wherein the plating copper on the bottom side of the first copper foil layer in the electroplating space is a first plating copper, and the plating copper on the top side of the second copper foil layer is a second plating copper;

(Step 10) forming circuits on the first copper foil layer and first plating copper to produce a first circuit layer, and forming circuits on the second copper foil layer and the second plating copper to form a second circuit layer.

2. The method of manufacturing a printed circuit board with embedded electronic components positioned by using a solder paste according to claim 1, wherein the insulating layer as described in Step 2 is made of a pure adhesive, a liquid resin or an epoxy resin and manufactured by attaching a plastic plate or coating a liquid adhesive onto the first copper foil layer and aging the adhesive or resin.

3. The method of manufacturing a printed circuit board with embedded electronic components positioned by using a solder paste according to claim 1, further comprising the following steps between Steps 2 and 3, wherein the first carrier board, the first copper foil layer and the insulating layer are drilled to form a plurality of alignment holes and a plurality of fixing holes thereon; the alignment holes are provided for the purpose of alignment required by a follow-up process and the fixing holes are provided for receiving a fastener to achieve a fixing effect required by a follow-up process.

4. The method of manufacturing a printed circuit board with embedded electronic components positioned by using a solder paste according to claim 1, wherein the opening as described in Step 3 is a single opening, and the single opening has a size large enough to cover the portion of the electrode of the embedded electronic component.

5. The method of manufacturing a printed circuit board with embedded electronic components positioned by using a solder paste according to claim 1, wherein the opening as described in Step 3 includes a plurality of openings, and each opening has a size large enough to cover the portion of an electrode of the embedded electronic component.

6. The method of manufacturing a printed circuit board with embedded electronic components positioned by using a solder paste according to claim 1, wherein the electronic component as described in Step 4 is an active electronic component, a passive electronic component, a light emitting component, or a combination thereof.

7. The method of manufacturing a printed circuit board with embedded electronic components positioned by using a solder paste according to claim 1, wherein the dielectric layer as described in Step 6 is made of a polyester film with high resin content, a dielectric film, or a combination of the polyester film and the dielectric film.

8. The method of manufacturing a printed circuit board with embedded electronic components positioned by using a solder paste according to claim 1, wherein the dielectric layer as described in Step 6 has a slot formed thereon in advance for receiving the electronic component, and the slot is formed by mechanical drilling, laser drilling, or die punching.

9. The method of manufacturing a printed circuit board with embedded electronic components positioned by using a solder paste according to claim 1, wherein the dielectric layer as described in Step 6 includes a first dielectric layer, a second dielectric layer and a third dielectric layer, and in Step 6, a first dielectric layer is set on the insulating layer; a second dielectric layer is set on the first dielectric layer; a third dielectric layer is set on the second dielectric layer and the electronic component; a first laminar circuit layer is added onto the third dielectric layer, and the first laminar circuit layer includes the second copper foil layer disposed on the third dielectric layer and the second carrier board disposed on the second copper foil layer.

10. The method of manufacturing a printed circuit board with embedded electronic components positioned by using a solder paste according to claim 9, wherein the first dielectric layer, the second dielectric layer, the third dielectric layer and the first laminar circuit layer are drilled to form a hole at a position corresponsive to the fixing hole of the first copper foil layer in advance, so that penetrating fixing holes are formed on the first dielectric layer, the second dielectric layer, the third dielectric layer and the first laminar circuit layer respectively and provided for receiving a fastener to achieve a fixing effect.

11. The method of manufacturing a printed circuit board with embedded electronic components positioned by using a solder paste according to claim 1, wherein the method of removing the solder paste layer as described in Step 8 uses a chemical solution including nitric acid solution to wash away the solder paste layer.

12. The method of manufacturing a printed circuit board with embedded electronic components positioned by using a solder paste according to claim 1, wherein the step of removing the first carrier board and the second carrier board as described in Step 7 further comprises the step of forming a penetrating hole by mechanical drilling.

13. The method of manufacturing a printed circuit board with embedded electronic components positioned by using a solder paste according to claim 12, wherein the copper plating and electroplating processes as described in Step 9 further comprises the step of performing copper plating and electroplating processes to the hole wall of the penetrating hole to form a plating copper, and the plating copper at the hole wall of the penetrating hole is a third plating copper.

14. The method of manufacturing a printed circuit board with embedded electronic components positioned by using a solder paste according to claim 1, further comprises the following steps after Step 10, wherein a fourth dielectric layer is set under the first circuit layer, a fifth dielectric layer is set on top of the second circuit layer, a lamination process of a laminar circuit layer is performed to outer layers of the fourth dielectric layer and the fifth dielectric layer, or a lamination of a third laminar circuit layer is performed to the bottom side the fourth dielectric layer and a lamination of a fourth laminar circuit layer is performed to the top side of the fifth dielectric layer, and the electronic component, the third laminar circuit layer, and the fourth laminar circuit layer are electrically conducted, so as to produce a multi-layer printed circuit board with an embedded electronic component.

15. The method of manufacturing a printed circuit board with embedded electronic components positioned by using a solder paste according to claim 14, wherein the multi-layer printed circuit board has a penetrating hole formed by mechanical drilling, and a copper metallization and a through-hole plating are performed to the penetrating hole, so that the electronic component is electrically conducted to the first circuit layer, the second circuit layer, the third laminar circuit layer, and the fourth laminar circuit layer.

* * * * *